United States Patent
Lin et al.

(10) Patent No.: US 8,558,106 B2
(45) Date of Patent: Oct. 15, 2013

(54) SOLAR CELL DEVICE AND METHOD FOR FABRICATING THE SAME

(75) Inventors: Chin-Ching Lin, Taichung (TW); Mei-Ching Chiang, Taipei County (TW); Hsiang-Chuan Chen, Taoyuan County (TW); Jen-You Chu, Changhua County (TW); Yi-Ping Chen, Kaohsiung County (TW); Pei-Chen Chuang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 390 days.

(21) Appl. No.: 12/754,544

(22) Filed: Apr. 5, 2010

(65) Prior Publication Data

US 2011/0088761 A1    Apr. 21, 2011

(30) Foreign Application Priority Data

Oct. 20, 2009   (TW) .............................. 98135353 A (51) Int. Cl.
*H01L 31/00* (2006.01)
*H01L 21/00* (2006.01)

(52) U.S. Cl.
USPC ........... 136/256; 136/252; 136/255; 136/257; 136/261; 438/57; 438/69

(58) Field of Classification Search
USPC ......... 136/244, 250, 251, 252, 256, 257, 259, 136/261, 255; 438/57, 69
See application file for complete search history.

(56) References Cited

U.S. PATENT DOCUMENTS

| | | | |
|---|---|---|---|
| 4,663,495 A * | 5/1987 | Berman et al. ................. | 136/248 |
| 4,808,462 A | 2/1989 | Yaba et al. | |
| 5,078,803 A | 1/1992 | Pier et al. | |
| 5,248,621 A | 9/1993 | Sano | |
| 5,998,730 A * | 12/1999 | Shiozaki et al. ............... | 136/256 |
| 6,268,050 B1 | 7/2001 | Watanabe et al. | |
| 6,268,059 B1 | 7/2001 | Cronin et al. | |
| 6,602,606 B1 | 8/2003 | Fujisawa et al. | |
| 6,656,523 B2 | 12/2003 | Russo et al. | |
| 6,991,849 B2 | 1/2006 | Oya | |
| 7,179,527 B2 | 2/2007 | Sato et al. | |
| 7,224,432 B2 | 5/2007 | Sasaki et al. | |

(Continued)

FOREIGN PATENT DOCUMENTS

| | | |
|---|---|---|
| EP | 0962428 A1 | 8/1999 |
| JP | 2004204173 A | 7/2004 |

(Continued)

OTHER PUBLICATIONS

Juarez et al. Low-resistivity ZnO:F:Al transparent thin films. Solar eneergy materials & solar cells 82 (2004) 35-43.*

(Continued)

*Primary Examiner* — Jonathan Johnson
*Assistant Examiner* — Lindsey Bernier (57) ABSTRACT

A solar cell device is provided, including a transparent substrate, a transparent conductive layer disposed over the transparent substrate, a photovoltaic element formed over the composite transparent conductive layer, and an electrode layer disposed over the photovoltaic element. In one embodiment, the transparent conductive layer includes lithium and fluorine-co-doped tin oxides, and the lithium and fluorine-co-doped tin oxides have a lithium doping concentration of about 0.2~2.3% and a fluorine doping concentration of about 0.1~2.5%.

18 Claims, 8 Drawing Sheets

(56) References Cited

U.S. PATENT DOCUMENTS

| | | | |
|---|---|---|---|
| 7,320,827 B2 | 1/2008 | Fujisawa et al. | |
| 7,364,808 B2 | 4/2008 | Sato et al. | |
| 7,368,655 B2 | 5/2008 | Blieske et al. | |
| 7,374,822 B2 | 5/2008 | Nakabeppu et al. | |
| 2006/0090790 A1* | 5/2006 | Kobayashi et al. | 136/256 |
| 2007/0074757 A1 | 4/2007 | Mellott et al. | |
| 2009/0162697 A1* | 6/2009 | Cheng et al. | 428/702 |
| 2010/0288348 A1* | 11/2010 | Lin et al. | 136/256 |
| 2011/0088761 A1 | 4/2011 | Lin et al. | |
| 2011/0088778 A1* | 4/2011 | Lin et al. | 136/257 |

FOREIGN PATENT DOCUMENTS

| | | |
|---|---|---|
| JP | 2004338986 A | 12/2004 |
| JP | 2006117482 A | 5/2006 |
| JP | 2008020526 A | 1/2008 |
| WO | WO 00/55102 | 9/2000 |

OTHER PUBLICATIONS

US Patent Office, Office Action, U.S. Appl. No. 12/908,701, Jun. 21, 2012, US.

* cited by examiner

SOLAR CELL DEVICE AND METHOD FOR FABRICATING THE SAME

CROSS REFERENCE TO RELATED APPLICATIONS

This Application claims priority of Taiwan Patent Application No. 98135353, filed on Oct. 20, 2009, the entirety of which is incorporated by reference herein.

BACKGROUND OF THE INVENTION

1. Field of the Invention

The invention relates to solar cell fabrication, and in particular to a solar cell device with transparent conductive films having improved light scattering characteristics and a method for fabricating the same.

2. Description of the Related Art

Demand and application for transparent conductive films have increased, due to increased development and use of solar cell devices. In addition to solar cell devices, other examples of electronic devices using flat display panels, such as liquid crystal displays, electroluminescence panels, plasma display panels, field emission displays, and touch panels all apply transparent conductive films as electrode materials therein.

Figure 1:
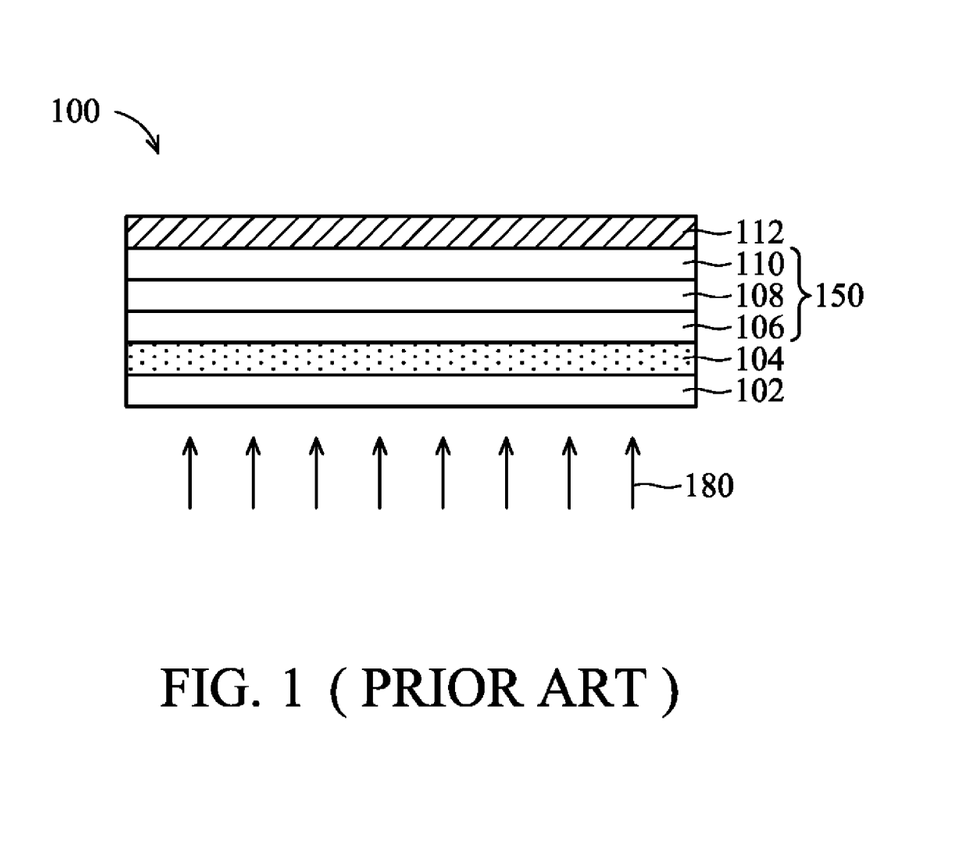
FIG. 1 is a cross section of a conventional solar cell device.

FIG. 1 is a cross section showing a transparent conductive film used in a conventional solar cell device. As shown in FIG. 1, the solar cell device is illustrated in a silicon thin film solar cell device 100, including main components such as a transparent conductive layer 104 made of fluorine doped tin oxide (FTO), an amorphous silicon thin film photovoltaic element 150 and an electrode layer 112 sequentially disposed over a glass substrate 102. Herein, the amorphous silicon thin film photovoltaic element 150 comprises components such as a p-type amorphous silicon layer, an intrinsic amorphous silicon layer 108 and an n-type amorphous silicon layer 110 sequentially stacked over the transparent conductive layer 104.

As shown in FIG. 1, the transparent conductive layer 104 made of fluorine doped tin oxide (FTO) has efficient light trapping ability. The transparent conductive layer 104 made of fluorine doped tin oxide (FTO), however, is formed with a planar configuration, and most light components of the incident light 180 such as sun light may directly strike on and then penetrate the amorphous silicon thin film photovoltaic element 150 but not produce photovoltaic reactions. After incident light 180 came from outside of the glass substrate 102 passing through the transparent 102 and the transparent conductive layer 104, thereby affecting an utility rate of the incident light 180 by the amorphous silicon thin film photovoltaic element 150.

Therefore, a transparent conductive layer with improved light scattering characteristics is needed to increase the utility rate of incident light of a solar cell device.

BRIEF SUMMARY OF THE INVENTION

A solar cell device and a method for fabricating the same are provided.

An exemplary solar cell device comprises a transparent substrate, a transparent conductive layer disposed over the transparent substrate, a photovoltaic element disposed over the transparent conductive layer, and an electrode layer disposed over the photovoltaic element. In one embodiment, the transparent conductive layer comprises lithium and fluorine co-doped tin oxides, and the lithium and fluorine co-doped tin oxides have a lithium doping concentration of about 0.2~2.3 at % and a fluorine doping concentration of about 0.1~2.5 at %.

An exemplary method for fabricating a solar cell device comprises providing a transparent substrate. A transparent conductive layer is formed over the transparent substrate. A photovoltaic element is formed over the transparent conductive layer. An electrode layer is disposed over the photovoltaic element. In one embodiment, the transparent conductive layer comprises lithium and fluorine co-doped tin oxides, and the lithium and fluorine co-doped tin oxides have a lithium doping concentration of about 0.2~2.3 at % and a fluorine doping concentration of about 0.1~2.5 at %.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 2-5 are cross sections showing a method for fabricating a solar cell device according to an embodiment of the invention.

Figure 2:
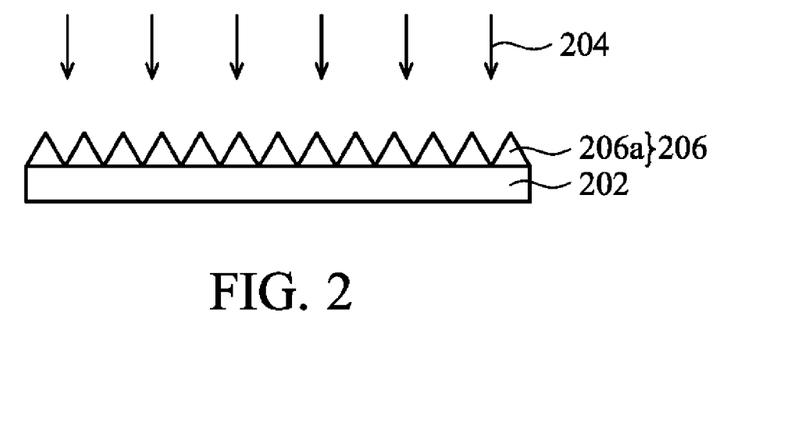
FIGS. 2-5 are cross sections showing a method for fabricating a solar cell device according to an embodiment of the invention.

As shown in FIG. 2, a transparent substrate 202, such as a glass substrate, a polymer thin film or a flexible substrate, is first provided. Next, a thin film deposition process 204 is performed to form a transparent conductive layer 206 over the transparent substrate 202. The thin film deposition process 204 can be, for example, a chemical spraying process or an atmosphere chemical synthesizing process, and the transparent conductive layer 206 may be formed with a material such as lithium and fluorine co-doped tin oxide (Li—F:$SnO_2$) having a lithium doping concentration of about 0.2~2.3 at % and a fluorine doping concentration of about 0.1~2.5 at %. Herein, the transparent conductive layer 206 formed by the thin film deposition process 204 comprises a plurality of polyhedron grains 206a formed on a top surface of the transparent substrate 202, thereby showing a non-planar surface configuration rather than the planar configuration of the transparent layer made of conventional fluorine-doped tin oxides.

Figure 3:
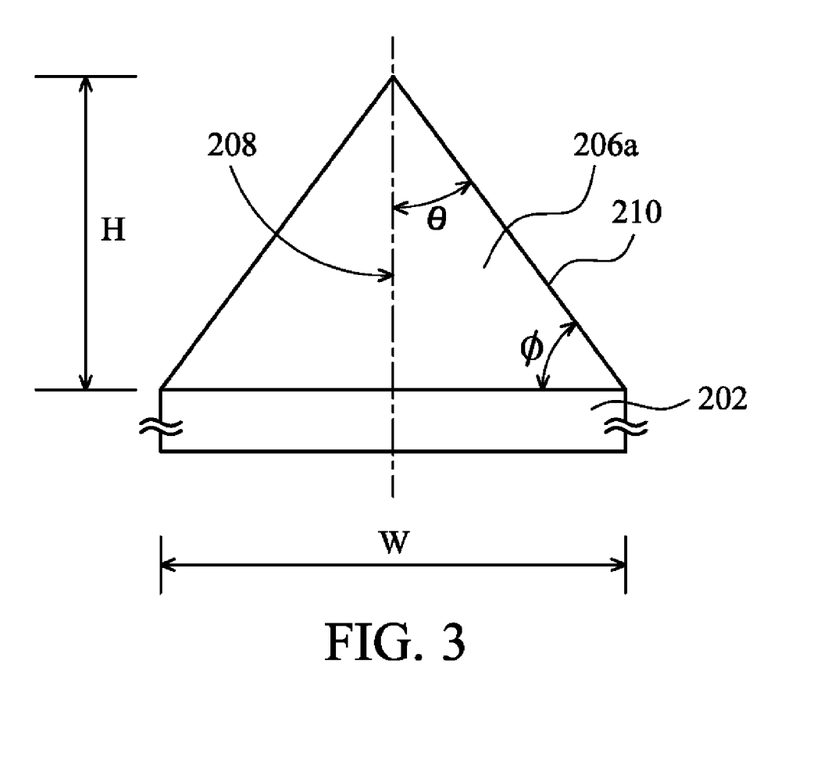

In FIG. 3, an enlargement of one of the polyhedron grains 206a is illustrated. As shown in FIG. 3, the polyhedron grain 206a comprises a plurality of sidewall surfaces of a number not less than three and a normal line 208 perpendicular to a top surface of the transparent substrate 202. An included angle $\phi$ of about 45°~90° is provided between one of the sidewall surfaces 210 and the transparent substrate 202, and an included angle $\theta$ of about 0°~45° is provided between the normal line 208 and each of the sidewall surfaces 210. A bottom surface of the polyhedron grain 206a is formed with a diameter W of about 100~2000 nm, and each of the polyhedron grain 206a has a thickness H of about 300~1000 nm.

In one embodiment, while the transparent conductive layer 204 is formed by the chemical spraying process, droplets having a size of about 5-15 μm formed by a gaseous mixture including carrier gases such as air, oxygen, nitrogen, and reaction gases such as $Sn(OH)_4$, $NH_4F$, LiF and Li(OH) are formed under a temperature of about 200-650° C. by an atomizer having a oscillation frequency of about 1.5 KHz~2.6 Mhz or a fine nozzle having an opening of about 10 μm and provided to the heated transparent substrate 202 to thereby form the transparent conductive layer 206 comprising the polyhedron grains 206a.

Since the transparent conductive layer 206 are composed of the plurality of the polyhedron grains 206a, thereby having a non-planar top surface and a higher haze level of about 20~60%. Since the polyhedron grains 206a in the transparent conductive layer 206 is advantageous for scattering light illuminated on the solar cell device and passes thereof into the sequential layers, thereby increasing light components being arrived the photovoltaic conversion element and photovoltaic conversion efficiency of the photovoltaic conversion element. In one embodiment, according to a measurement using bi-directional reflectance distribution function measurement method, the transparent conductive layer 206 formed of the polyhedron grains 206a obtained in the thin film deposition process 204 may show a light field distribution angle of about 40°~80°, preferable of about 45°~60°.

Figure 4:
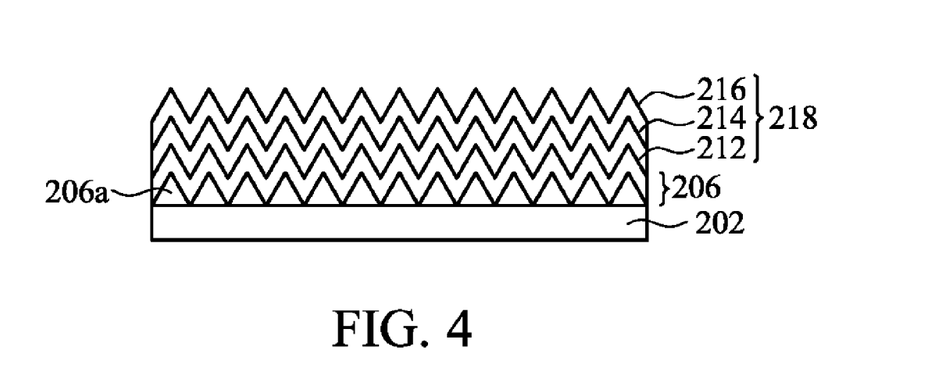

In FIG. 4, a thin film deposition process (not shown) is performed to form a photovoltaic element 218 over the transparent conductive layer 206 illustrated in FIG. 2. Herein, the photovoltaic element 218 is illustrated as an amorphous silicon p-i-n photovoltaic structure, but is not limited thereto. The photovoltaic element 218 can be formed as other types of photovoltaic structures such as a dye sensitized solar cell (DSSC) structure, a nanocrystalline silicon structure, or a photovoltaic element formed with a tandem structure. In the thin film deposition process, a p-type amorphous silicon layer 212 is first formed over the transparent conductive layer 206, an intrinsic (non-doped) amorphous silicon layer 214 is then formed over the p-type amorphous silicon layer 212, and an n-type amorphous silicon layer 216 is then formed over the intrinsic amorphous silicon layer 214. As shown in FIG. 4, since the transparent conductive layer 206 is formed with a non-planar top surface such as a concave-convex configuration, thereby the n-type amorphous silicon layer 216, the intrinsic amorphous silicon layer 214, and the p-type amorphous silicon layer 212 conformably formed over the transparent conductive layer 206 also have a non-planar top surface such as a concave-convex configuration. The thin film deposition process can be in-situ performed in the same processing apparatus, wherein the three films of the photovoltaic element 218 are in-situ doped with predetermined types of dopants. Therefore, no additional ion implanting process is needed, thus simplifying the fabrication process of the photovoltaic element 218. Herein, the thin film deposition process for forming the photovoltaic element 218 can be, for example, plasma enhanced chemical vapor deposition.

Figure 5:
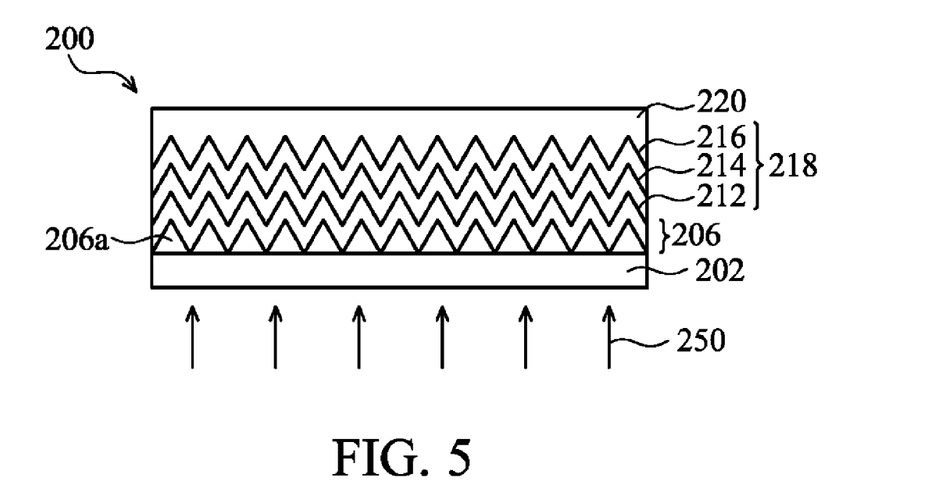

As shown in FIG. 5, a thin film deposition process (not shown) is then performed to form an electrode layer 220 over the photovoltaic element 218 illustrated in FIG. 4. Herein, the thin film deposition process can be a process such as sputtering and the electrode layer 220 may comprise materials such as Al, Ti, Mo, or Ag. As shown in FIG. 5, a substantially fabricated solar cell device 200 is shown, wherein incident light 250 may pass through the transparent substrate 202 and the transparent conductive layer 206 to arrive on the photovoltaic element 218 to produce photovoltaic conversion reactions.

In the present embodiment, the solar cell device 200 utilizes the transparent conductive layer 206 made of a plurality of polyhedron grains 206a, and the polyhedron grains 206a scatter the incident light 250 passing through the transparent substrate 202, thereby increasing input light amount arriving at the photovoltaic element 218. The light utilizing rate of the incident light 250 of the photovoltaic element 218 is thus improved. The novel transparent conductive layer may further improve the element performances of the solar cell device.

Figure 6:
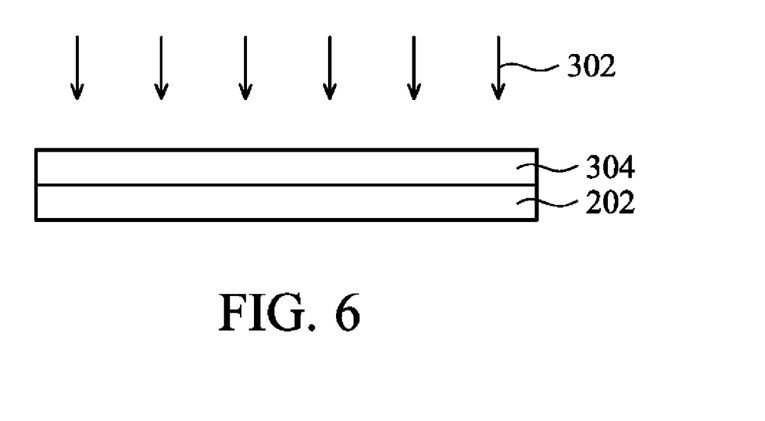
FIGS. 6-7 are cross sections showing a method for fabricating a solar cell device according to another embodiment of the invention.
Figure 7:
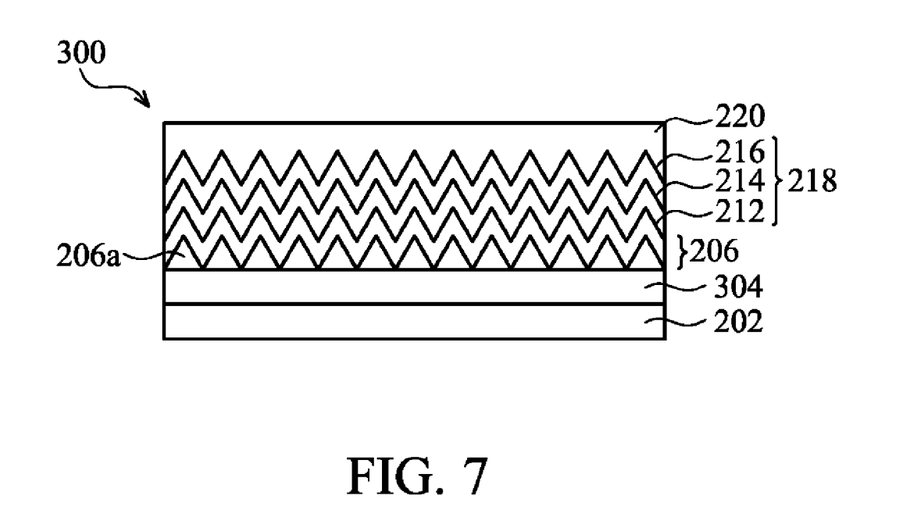

FIGS. 6-7 are cross sections showing a method for fabricating a solar cell device according to another embodiment of the invention. Herein, this embodiment is modified from the embodiment illustrated in FIGS. 2-5 and the only differences there between are discussed in the following paragraphs.

In FIG. 6, a transparent substrate 202, such as a glass substrate, a polymer thin film or a flexible substrate, is first provided. Next, a thin film deposition process 302 is performed to form an infrared filter layer 304 over the transparent substrate 202. The thin film deposition process 302 can be, for example, a chemical spraying process or an atmosphere chemical synthesizing process operated under a temperature of about 200~650° C., and the formed infrared filter layer 304 may be formed with a material such as lithium and fluorine-co-doped tin oxides (Li—F:$SnO_2$) having a lithium doping concentration of about 1.5~3.5 at % and a fluorine doping concentration of about 0.5~3.5 at %, or fluorine and aluminum-co-doped zinc oxides (F—Al:ZnO) having a fluorine doping concentration of about 0.1~2.0 at % and an aluminum doping concentration of about 1~5 at %. In one embodiment, the infrared filter layer 304 is formed with a thickness of about 10~2000 nm and has a visible light transmission rate more than 70%, an infrared blocking rate greater than 30%, and a visible light haze level less than 5%, thereby lowering the transmission rate of light components of infrared wavelength (between 1100~1800 nm) in the light passing through the transparent substrate 202. Herein, the infrared filter layer 304 formed by the thin film deposition process 302 is formed on the transparent substrate 202 and has a planar surface configuration.

In one embodiment, while the infrared filter layer 304 is formed by the chemical spraying process, droplets having a size of about 5-80 μm formed by a gaseous mixture including carrier gases such as air, oxygen, nitrogen, and reaction gases such as $Sn(OH)_4$, $NH_4F$, LiF and Li(OH) are formed under a temperature of about 200-650° C. by an atomizer having a oscillation frequency of about 1.5 KHz~2.6 Mhz or a fine nozzle having an opening of about 10 μm and provided to the heated transparent substrate 202 to thereby form the infrared filter layer 304.

As shown in FIG. 7, the transparent conductive layer 206, the photovoltaic element 218, and the electrode layer 220 are sequentially formed over the infrared filter layer 304 by the processes illustrated in FIGS. 2-5, thereby completing fabrication of a solar cell device 300. In this embodiment, the solar cell 300 may include advantages such as improving light utilizing rate of the incident light 250 by the photovoltaic element 218 as that disused in the solar cell device 200, and other advantages such as preventing light components of infrared wavelengths of the incident light 250 transmitted into the solar cell device 300 from arriving at the photovoltaic element 218. Thus, temperature increases of the photovoltaic element 218 due to absorption of incident light 250 can be prevented and the photovoltaic efficiency of the photovoltaic element 218 can be protected from negative influences such as high operating temperature. The infrared filter layer 304 in the solar cell device 300 may thus improve operating stability and increases lifespan of the solar cell device 300.

EMBODIMENTS

Embodiment 1

Fabrication of a Transparent Conductive Layer Comprising Polyhedron Grains

An aqueous solution including 0.3 mole of $SnCl_2.5H_2O$ was provided, and 0.06 mole of $NH_4F$ and 0.09 mole of LiCl were then co-doped with it to obtain a mixed solution. Air was simultaneously conducted in a micro type droplet atomizer, and an atomizer in the micro type droplet atomizer was adjusted to uniformly mix the mixed solution with the air. A mixture of the mixed solution and the air was directly directed to a glass sample heated to a temperature of about 400° C. to perform a chemical vapor deposition, thereby forming a $SnO_2$:Li:F (Li—FTO) transparent conductive film comprising a plurality of polyhedron grains as illustrated in FIG. 2 and a non-planar surface configuration such as a concave-convex surface. The Li—FTO transparent conductive film was formed with a thickness of about 800 nm and the polyhedron grains therein was measured with a diameter of about 200-300 nm. Herein, a lithium doping concentration in the Li—FTO transparent conductive layer of about 0.3 at % and a fluorine doping concentration in the Li—FTO transparent conductive layer of 0.5 at % were measured. A light field distribution angle of about 45°-55° of the Li—FTO transparent conductive layer was also measured.

Embodiment 2

Fabrication of a Transparent Conductive Layer Comprising Polyhedron Grains

An aqueous solution including 0.3 mole of $SnCl_2.5H_2O$ was provided, and 0.06 mole of $NH_4F$ and 0.09 mole of LiCl were then co-doped with thereof to obtain a mixed solution. Air was simultaneously conducted in a micro type droplet atomizer, and an atomizer in the micro type droplet atomizer was adjusted to uniformly mix the mixed solution with the air. A mixture of the mixed solution and the air was directly directed to a glass sample heated to a temperature of about 450° C. to perform a chemical vapor deposition, thereby forming a $SnO_2$:Li:F (Li—FTO) transparent conductive film comprising a plurality of polyhedron grains as illustrated in FIG. 2 and a non-planar surface configuration such as a concave-convex surface. The Li—FTO transparent conductive film was formed with a thickness of about 800 nm and the polyhedron grains therein was measured with a diameter of about 500-600 nm. Herein, a lithium doping concentration in the Li—FTO transparent conductive layer of about 0.5 at % and a fluorine doping concentration in the Li—FTO transparent conductive layer of 0.3 at % were measured. A light field distribution angle of about 65°-75° of the Li—FTO transparent conductive layer was also measured.

Comparative Embodiment 1

Fabrication of a Transparent Conductive Layer

An aqueous solution including 0.3 mole of $SnCl_2.5H_2O$ was provided, and 0.045 mole of $NH_4F$ and 0.009 mole of LiCl were then co-doped with thereof to obtain a mixed solution. Air was simultaneously conducted in a micro type droplet atomizer, and an atomizer in the micro type droplet atomizer was adjusted to uniformly mix the mixed solution with the air. A mixture of the mixed solution and the air was directly directed to a glass sample heated to a temperature of about 360° C. to perform a chemical vapor deposition, thereby forming a $SnO_2$:Li:F (Li—FTO) transparent conductive film similar with that illustration in FIG. 1 which is formed with a planar surface configuration. The Li—FTO transparent conductive film was formed with a thickness of about 800. Herein, a lithium doping concentration in the Li—FTO transparent conductive layer is less than 0.2 at % and a fluorine doping concentration in the Li—FTO transparent conductive layer is of about 0.5 at %.

Light Reflection Tests

Figure 8:
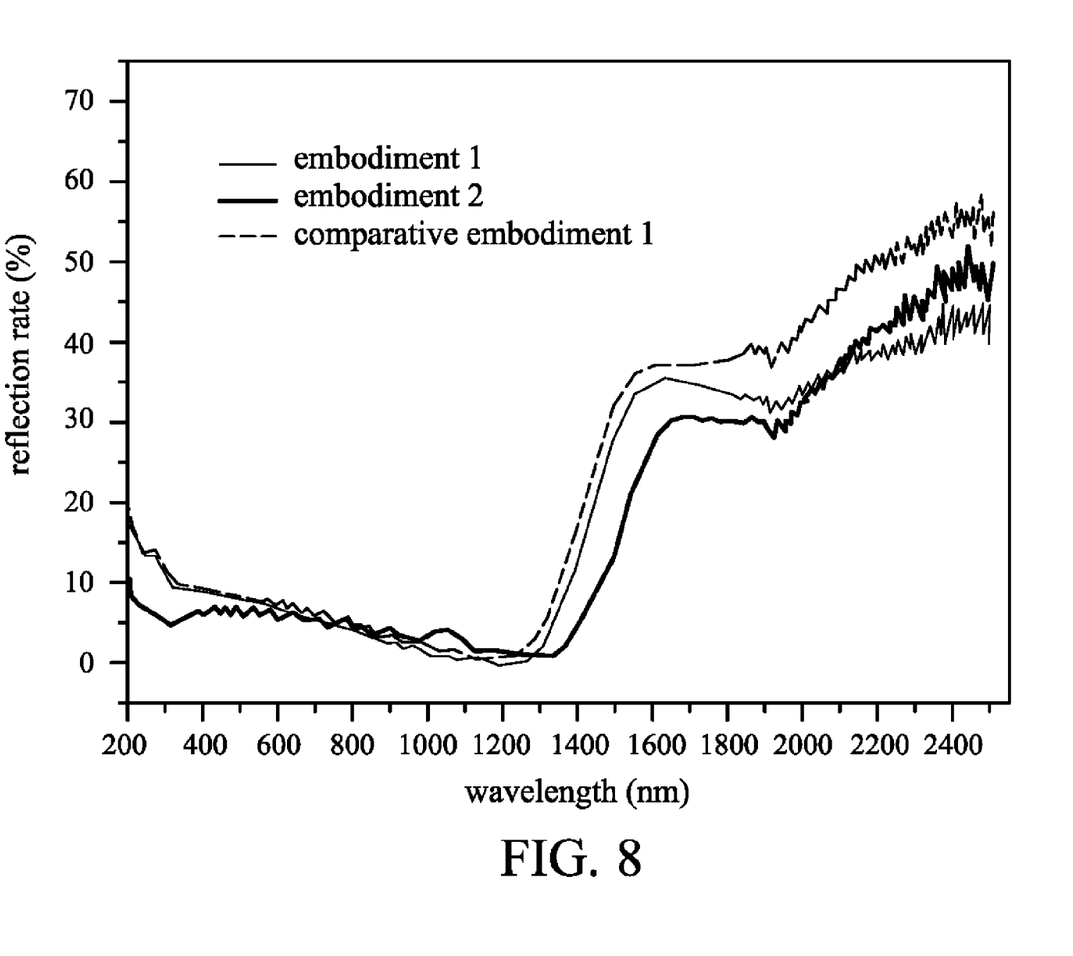
FIG. 8 shows the reflection rate of a transparent conductive layer of a solar cell device according to an embodiment of the invention and a comparative embodiment.

FIG. 8 shows light reflection results of the transparent conductive layers provided by Embodiments 1-2 and Comparative Embodiment 1 obtained by reflectance spectroscopy. Light reflection rate of the transparent conductive layers in Embodiments 1-2 and Comparative Embodiment 1 are significantly changed according to the lithium doping concentration therein. As shown in FIG. 8, as the transparent conductive layer having a lithium doping concentration of about 0.3 at % (embodiment 1) and 0.5 at % (embodiment 2) was provided, a maximum reflection rate of about 30% of incident light having of wavelength of about 1200-1800 nm was obtained. An absorption rate of about 40%~50% of incident light having of wavelength of about 1200-1800 nm was obtained while a lithium doping concentration of the transparent conductive layer was lower than 0.2 at %.

Light Absorption Tests

Figure 9:
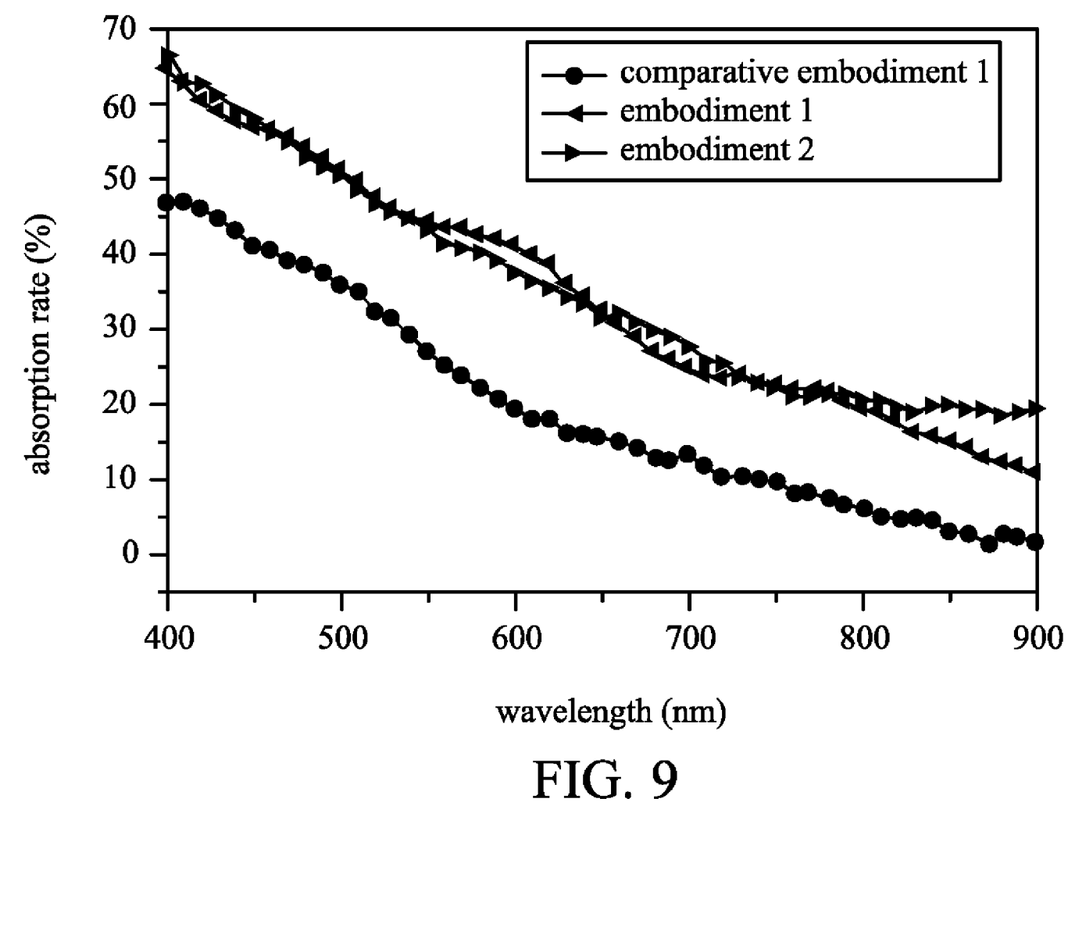
FIG. 9 shows absorption results of a transparent conductive layer of a solar cell device according to an embodiment of the invention and a comparative embodiment.

FIG. 9 shows light absorption results of the transparent conductive layers provided by Embodiments 1-2 and Comparative Embodiment 1 obtained by absorption spectroscopy. Light absorption rate of the transparent conductive layers in Embodiments 1-2 and Comparative Embodiment 1 is significantly changed according to the lithium doping concentration therein. As shown in FIG. 9, as the transparent conductive layer was provided with a lithium doping concentration of about 0.3 at % (embodiment 1) and 0.5 at % (embodiment 2), an absorption rate of about 30%≠65% of incident light having of wavelength of about 400-800 nm was obtained. An absorption rate of about 10%≠50% of incident light having of wavelength of about 400-800 nm was obtained while the transparent conductive layer was formed with a lithium doping concentration less than 0.2 at %.

Embodiment 3

An aqueous solution including 0.5 mole of $SnCl_2.5H_2O$ was provided, and 0.35 mole of $NH_4F$ and 0.075 mole of LiCl were then co-doped with thereof to obtain a $Sn(OH)_4$-containing solution. Air was simultaneously conducted in a micro type droplet atomizer, and an atomizer in the micro type droplet atomizer was adjusted to uniformly mix the Sn(OH)

$_4$-containing solution with the air and then adjusted to a flow rate of about 20 L/min to form an aerosol airflow with a size of about 5~8 μm. Next, the aerosol airflow was directly directed to a glass sample heated to a temperature of about 400° C. to form an infrared filter layer made of mainly tin oxide and a thickness of about 1000 nm by chemical vapor deposition. The atomizer was operated under an oscillation frequency of 1000 KHz and a lithium doping concentration in the infrared filter layer of about 1.5 at % and a fluorine doping concentration in the infrared filter layer of 1.0 at % was measured.

Embodiment 4

An aqueous solution including 0.5 mole of $SnCl_2.5H_2O$ was provided, and 0.35 mole of $NH_4F$ and 0.1 mole of LiCl were then co-doped with thereof to obtain a $Sn(OH)_4$-containing solution. Air was simultaneously conducted in a micro type droplet atomizer, and an atomizer in the micro type droplet atomizer was adjusted to uniformly mix the $Sn(OH)_4$-containing solution with the air and then adjusted to a flow rate of about 20 L/min to form an aerosol airflow with a size of about 5~8 μm. Next, the aerosol airflow was directly feed to a glass sample heated to a temperature of about 400° C. to form an infrared filter layer made of mainly tin oxide and a thickness of about 1000 nm by chemical vapor deposition. The atomizer was operated under an oscillation frequency of 1000 KHz and a lithium doping concentration in the infrared filter layer of about 2.0 at % and a fluorine doping concentration in the infrared filter layer of 2.0 at % were measured.

Embodiment 5

An aqueous solution including 0.5 mole of $SnCl_2.5H_2O$ was provided, and 0.35 mole of $NH_4F$ and 0.125 mole of LiCl were then co-doped with thereof to obtain a $Sn(OH)_4$-containing solution. Air was simultaneously conducted in a micro type droplet atomizer, and an atomizer in the micro type droplet atomizer was adjusted to uniformly mix the $Sn(OH)_4$-containing solution with the air and then adjusted to a flow rate of about 20 L/min to form an aerosol airflow with a size of about 5~8 μm. Next, the aerosol airflow was directly directed to a glass sample heated to a temperature of about 400° C. to form an infrared filter layer made of mainly tin oxide and a thickness of about 1000 nm by chemical vapor deposition. The atomizer was operated under an oscillation frequency of 1000 KHz and a lithium doping concentration in the infrared filter layer of about 2.5 at % and a fluorine doping concentration in the infrared filter layer of 2.6 at % were measured.

Comparative Embodiment 2

An aqueous solution including 0.5 mole of $SnCl_2.5H_2O$ was provided, and 0.35 mole of $NH_4F$ were then co-doped to obtain a $Sn(OH)_4$-containing solution. Air was simultaneously conducted in a micro type droplet atomizer, and an atomizer in the micro type droplet atomizer was adjusted to uniformly mix the $Sn(OH)_4$-containing solution with the air and then adjusted to a flow rate of about 20 L/min to form an aerosol airflow with a size of about 5~8 μm. Next, the aerosol airflow was directly directed to a glass sample heated to a temperature of about 400° C. to form an infrared filter layer made of mainly tin oxide with a thickness of about 1000 nm formed by chemical vapor deposition. The atomizer was operated under an oscillation frequency of 1000 KHz and a lithium doping concentration in the infrared filter layer of 0 at % and a fluorine doping concentration in the infrared filter layer of 0.5 at % were measured.

Light Reflection Tests

Figure 10:
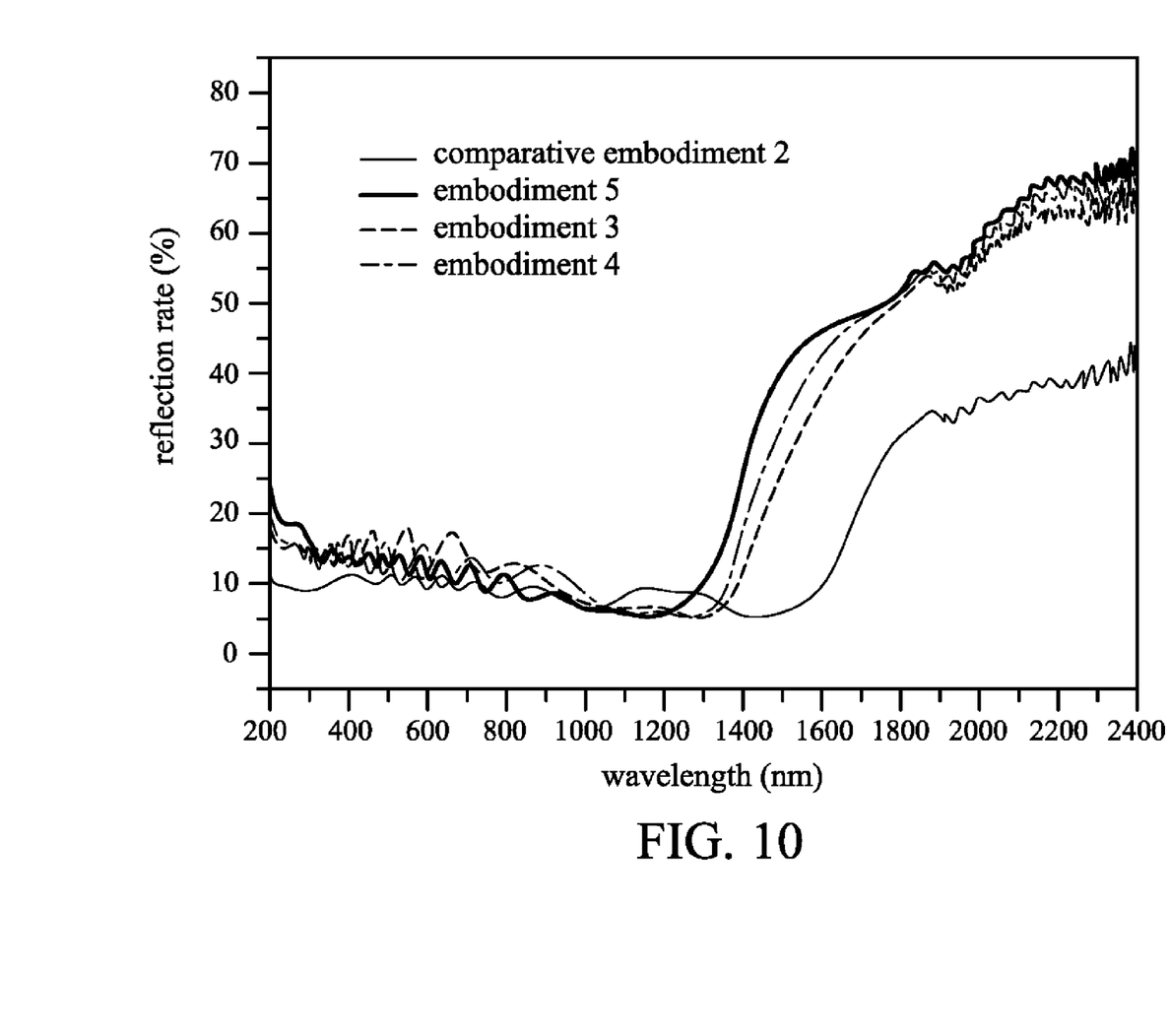
FIG. 10 shows reflection results of an infrared filter layer of a solar cell device according to an embodiment of the invention and a comparative embodiment.

FIG. 10 shows light reflection results of the infrared filter layers provided by Embodiments 3-5 and Comparative Embodiment 2 obtained by reflectance spectroscopy. A light reflection rate of the infrared filter layers in Embodiments 3-5 and Comparative Embodiment 2 is significantly changed according to a lithium doping concentration and a fluorine doping concentration therein. As shown in FIG. 10, as lithium and fluorine doping concentrations in the infrared filter layers are of about 1.5 at % and 1.0 at % (embodiment 3), 2.0 at % and 2.0 at % (embodiment 4), and 2.5 at % and 2.6 at % (embodiment 5), respectively, and reflection rates of about 30%, 35%, and 40% of incident light having a wavelength of about 1500 nm were respectively obtained. A reflection rate of about 5% of incident light having a wavelength of about 1600 nm was obtained while lithium and fluorine doping concentrations in the infrared filter layer were 0 at % and 0.5 at % (comparative embodiment 2).

Light Transmission Tests

Figure 11:
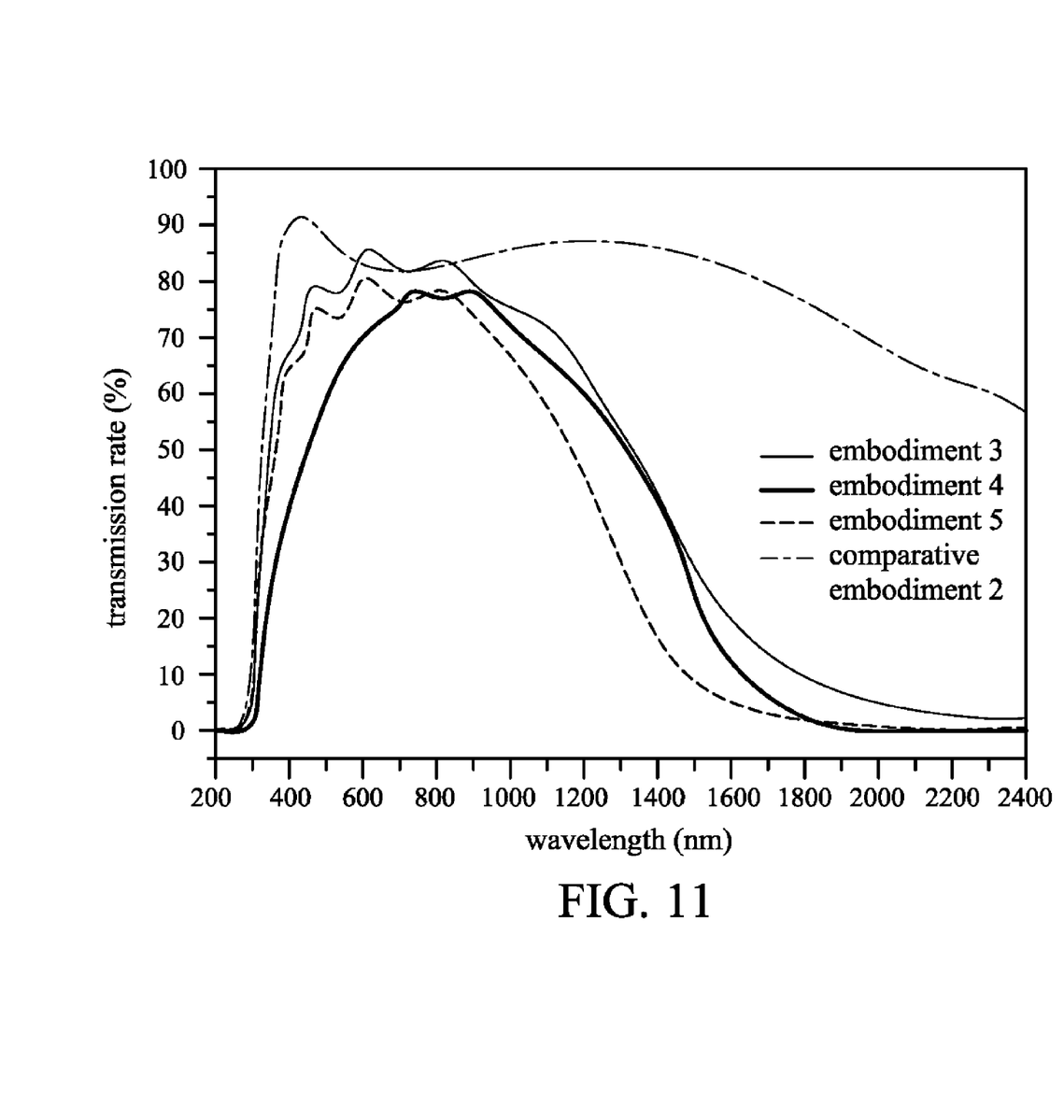
FIG. 11 shows transmission results of an infrared filter layer of a solar cell device according to an embodiment of the invention and a comparative embodiment.

FIG. 11 shows light transmission results of the infrared filter layers provided by Embodiments 3-5 and Comparative Embodiment 2 obtained by transmission spectroscopy. Light transmission rate of the infrared filter layers in Embodiments 3-5 and Comparative Embodiment 2 are significantly changed according to lithium and fluorine doping concentrations therein. As shown in FIG. 11, as lithium and fluorine doping concentrations in the infrared filter layers are of about 1.5% and 1.0% (embodiment 3), 2.0% and 2.0% (embodiment 4), and 2.5 at % and 2.6 at % (embodiment 5), respectively, a light transmission rate of about 30%, 20%, and 10% of incident light having of wavelength of about 1400 nm were respectively obtained. A transmission rate of about 80% of incident light having of wavelength of about 1600 nm was obtained while as lithium and fluorine doping concentrations in the infrared filter layer were of 0% and 0.5% (comparative embodiment 2).

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A solar cell device, comprising
   a transparent substrate;
   a transparent conductive layer disposed over the transparent substrate, wherein the transparent conductive layer comprises lithium and fluorine-co-doped tin oxides made of a plurality of polyhedron grains with a diameter of about 100-2000 nm, and the lithium and fluorine-co-doped tin oxides have a lithium doping concentration of about 0.2~2.3 at % and a fluorine doping concentration of about 0.1~2.5 at %;
   a photovoltaic element disposed over the transparent conductive layer; and
   an electrode layer disposed over the photovoltaic element.

2. The solar cell device as claimed in claim 1, wherein the transparent conductive layer has a non-planar top surface.

3. The solar cell device as claimed in claim 1, wherein the transparent conductive layer shows a light field distribution angle of about 40°~80°.

4. The solar cell device as claimed in claim 1, wherein the transparent conductive layer has a thickness of about 300~1000 nm.

5. The solar cell device as claimed in claim 1, wherein the photovoltaic element comprises a p-type amorphous silicon layer, an intrinsic amorphous silicon layer, and an n-type amorphous silicon layer.

6. The solar cell device as claimed in claim 1, wherein the electrode layer comprises Mo.

7. The solar cell device as claimed in claim 1, further comprising an infrared filter layer disposed between the transparent conductive layer and the transparent substrate.

8. The solar cell device as claimed in claim 7, wherein the infrared filter layer comprises lithium and fluorine-co-doped tin oxides or fluorine and aluminum-co-doped zinc oxides.

9. The solar cell device as claimed in claim 7, wherein the infrared filter layer comprises lithium and fluorine-co-doped tin oxides, and the lithium and fluorine-co-doped tin oxides in the infrared filter layer have a lithium doping concentration of about 1.5-3.5 at % and a fluorine doping concentration of about 0.5-3.5 at %.

10. The solar cell device as claimed in claim 7, wherein the infrared filter layer comprises fluorine and aluminum-co-doped zinc oxides, and the fluorine and aluminum-co-doped zinc oxides have a fluorine doping concentration of about 0.1~2.0 at % and an aluminum doping concentration of about 1~5 at %.

11. The solar cell device as claimed in claim 7, wherein the infrared filter layer shows a visible-light transmission rate more than 70% and a visible-light haze level less than 5%.

12. A method for fabricating a solar cell device, comprising:
providing a transparent substrate;
forming a transparent conductive layer over the transparent substrate, wherein the transparent conductive layer comprises lithium and fluorine-co-doped tin oxides having made of a plurality of polyhedron grains with a diameter of about 100-2000 nm, and the lithium and fluorine-co-doped tin oxides have a lithium doping concentration of about 0.2~2.3 at % and a fluorine doping concentration of about 0.1~2.5 at %;
forming a photovoltaic element over the transparent conductive layer; and
forming an electrode layer disposed over the photovoltaic element.

13. The method as claimed in claim 12, wherein the transparent conductive layer is formed by a chemical spraying process or an atmosphere chemical synthesizing process.

14. The method as claimed in claim 12, wherein formation of the photovoltaic element further comprises:
forming a p-type amorphous silicon layer over the transparent conductive layer;
forming an intrinsic amorphous silicon layer over the p-type amorphous silicon layer; and
forming an n-type amorphous silicon layer over the intrinsic amorphous silicon layer.

15. The method as claimed in claim 12, wherein the transparent conductive layer has a non-planar top surface.

16. The method as claimed in claim 12, wherein the transparent conductive layer shows a light field distribution angle of about 40°~80°.

17. The method as claimed in claim 12, wherein the transparent conductive layer has a thickness of about 300~1000 nm.

18. The method as claimed in claim 12, further comprising forming an infrared filter layer over the transparent substrate prior to formation of the transparent conductive layer over the transparent substrate.

\* \* \* \* \*